United States Patent
Kim

[19]

[11] Patent Number: 6,055,742
[45] Date of Patent: May 2, 2000

[54] RETICLE CLEANING APPARATUS FOR WAFER EXPOSURE SYSTEM

[75] Inventor: Beom-Soo Kim, Choongcheongbuk-Do, Rep. of Korea

[73] Assignee: LG Semicon Co., Ltd., Choongcheongbuk-Do, Rep. of Korea

[21] Appl. No.: 09/156,602

[22] Filed: Sep. 18, 1998

[30] Foreign Application Priority Data

Dec. 30, 1997 [KR] Rep. of Korea .................. 78887/1997

[51] Int. Cl.[7] .................................................. F26B 11/22
[52] U.S. Cl. ................. 34/202; 34/212; 34/222; 34/223; 34/224; 34/230
[58] Field of Search .................... 454/187, 195; 34/58, 59, 312, 72, 90, 202, 210, 212, 219, 222, 224, 223, 230

[56] References Cited

U.S. PATENT DOCUMENTS

| | | | |
|---|---|---|---|
| 3,717,169 | 2/1973 | Schoger | 137/412 |
| 4,963,069 | 10/1990 | Wurst et al. | 414/416 |
| 5,069,235 | 12/1991 | Vetter et al. | 134/113 |
| 5,181,819 | 1/1993 | Sakata et al. | 414/217 |
| 5,222,310 | 6/1993 | Thompson et al. | 34/202 |
| 5,351,415 | 10/1994 | Brooks et al. | 34/389 |
| 5,430,303 | 7/1995 | Matsumoto et al. | 250/492.2 |
| 5,559,584 | 9/1996 | Miyaji et al. | 355/73 |
| 5,575,081 | 11/1996 | Ludwig | 34/218 |
| 5,628,121 | 5/1997 | Brooks et al. | 34/61 |
| 5,653,045 | 8/1997 | Ferrell | 34/341 |
| 5,704,833 | 1/1998 | Reix et al. | 454/187 |
| 5,724,748 | 3/1998 | Brooks et al. | 34/90 |
| 5,746,875 | 5/1998 | Maydan et al. | 156/345 |
| 5,828,572 | 10/1998 | Hasegawa et al. | 364/486.24 |
| 5,931,721 | 8/1999 | Rose et al. | 451/89 |
| 5,937,541 | 8/1999 | Weigand et al. | 34/565 |
| 5,960,562 | 10/1999 | Nishida et al. | 34/574 |
| 5,967,156 | 10/1999 | Rose et al. | 134/7 |
| 5,974,680 | 11/1999 | Anderson et al. | 34/58 |
| 5,980,187 | 11/1999 | Verhovsky | 414/416 |
| 5,997,398 | 12/1999 | Yamada et al. | 454/187 |

Primary Examiner—Henry Bennett
Assistant Examiner—Andrea M. Joyce
Attorney, Agent, or Firm—Morgan, Lewis & Bockius LLP

[57] ABSTRACT

A reticle cleaning apparatus for a wafer exposure system includes a chamber enclosing the reticle, a door opening and closing at least one side of the chamber, a door switching member opening and closing the door coupled to the chamber including the door, a gas injection nozzle at an upper portion of the chamber, a nozzle transport member moving the gas injection nozzle in a vertical direction, a gas supply member supplying a cleaning gas into the gas injection nozzle, an ion injection nozzle over the gas injection nozzle, an ion supply member supplying ions into the ion injection nozzle, and a drain member draining the cleaning gas outside the chamber.

15 Claims, 3 Drawing Sheets

RETICLE CLEANING APPARATUS FOR WAFER EXPOSURE SYSTEM

This application claims the benefits of Korean Application No. 97-78887 filed Dec. 30, 1997, which is hereby incorporated by reference.

BACKGROUND OF THE INVENTION

1. Field of the Invention

The present invention relates to a cleaning apparatus, and more particularly, to a reticle cleaning apparatus for a wafer exposure system. Although the present invention is suitable for a wide scope of applications, it is particularly suitable for cleaning a reticle just before a wafer exposing process.

2. Discussion of the Related Art

Conventionally, a reticle is manually taken out one by one from a reticle carrier storing a plurality of reticles before a patterned reticle is transferred into a reticle cassette library in an exposure system. A nitrogen gun connected to a nitrogen supply device is then aimed at the surface of the reticle and triggered accordingly in order for the nitrogen gas released from the nitrogen gun to carry out a cleaning operation of the reticle.

FIG. 1 is a flow chart illustrating a path of reticle received in an exposure system according to the background art. A plurality of reticles received in a reticle cassette library 1 are moved by a reticle robot 2 one by one into an interim storage unit 3 so as to separate a cover enclosing the reticles. The reticles separated by the interim storage unit 3 are moved by the reticle robot 2 to a turn table 4 and then to a reticle stage 5.

However, in the conventional exposure system using a manual cleaning method, the reticle has to be cleaned through a plurality of steps before and after receiving into the exposure system. Consequently, undesired exterior substances, such as dust, may be attached on the surface of the reticle, thereby interfering a scanning light during the exposure process. As a result, a reticle pattern is not appropriately printed onto a photoresist film on a target wafer.

SUMMARY OF THE INVENTION

Accordingly, the present invention is directed to a reticle cleaning apparatus for a wafer exposure system that substantially obviates one or more of problems due to limitations and disadvantages of the related art.

An object of the present invention to provide a reticle cleaning apparatus for a wafer exposure system capable of minimizing a reticle exposure on undesired exterior substances by disposing the reticle cleaning apparatus at the exposure system itself.

Additional features and advantages of the invention will be set forth in the description which follows and in part will be apparent from the description, or mat be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a reticle cleaning apparatus for a wafer exposure system includes a polyhedral chamber, at least one side thereof being opened/closed by a door, a door switching member for opening/closing the door to the chamber, a gas injection nozzle for being disposed in an upper space in the chamber, a nozzle transport member for moving the gas injection nozzle upwardly and downwardly, a gas supply member for supplying cleansing gas into the gas injection nozzle, an ion injection nozzle for being disposed above the gas injection nozzle in the chamber, an ion supply member for supplying ions into the ion injection nozzle, and a drain member for externally discharging the cleansing gas injected into the chamber through the gas injection nozzle.

In another aspect of the invention, a reticle cleaning apparatus for a wafer exposure system includes a chamber enclosing the reticle, a door opening and closing at least one side of the chamber, a door switching member opening and closing the door coupled to the chamber including the door, a gas injection nozzle at an upper portion of the chamber, a nozzle transport member moving the gas injection nozzle in a vertical direction, a gas supply member supplying a cleaning gas into the gas injection nozzle, an ion injection nozzle over the gas injection nozzle, an ion supply member supplying ions into the ion injection nozzle, and a drain member draining the cleaning gas outside the chamber.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
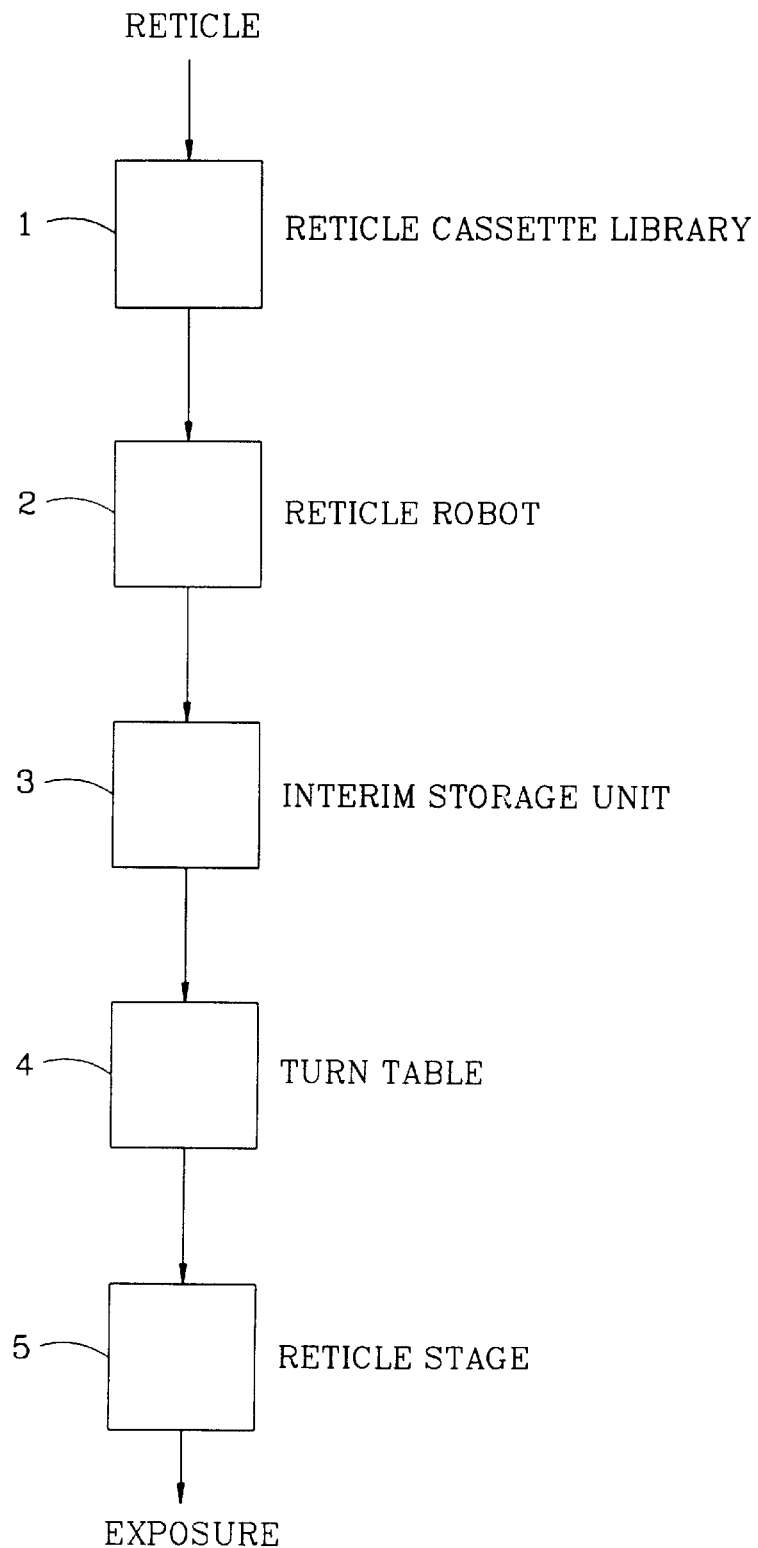
FIG. 1 is a flow chart illustrating a path of a reticle received in an exposure system according to the background art.
Figure 2:
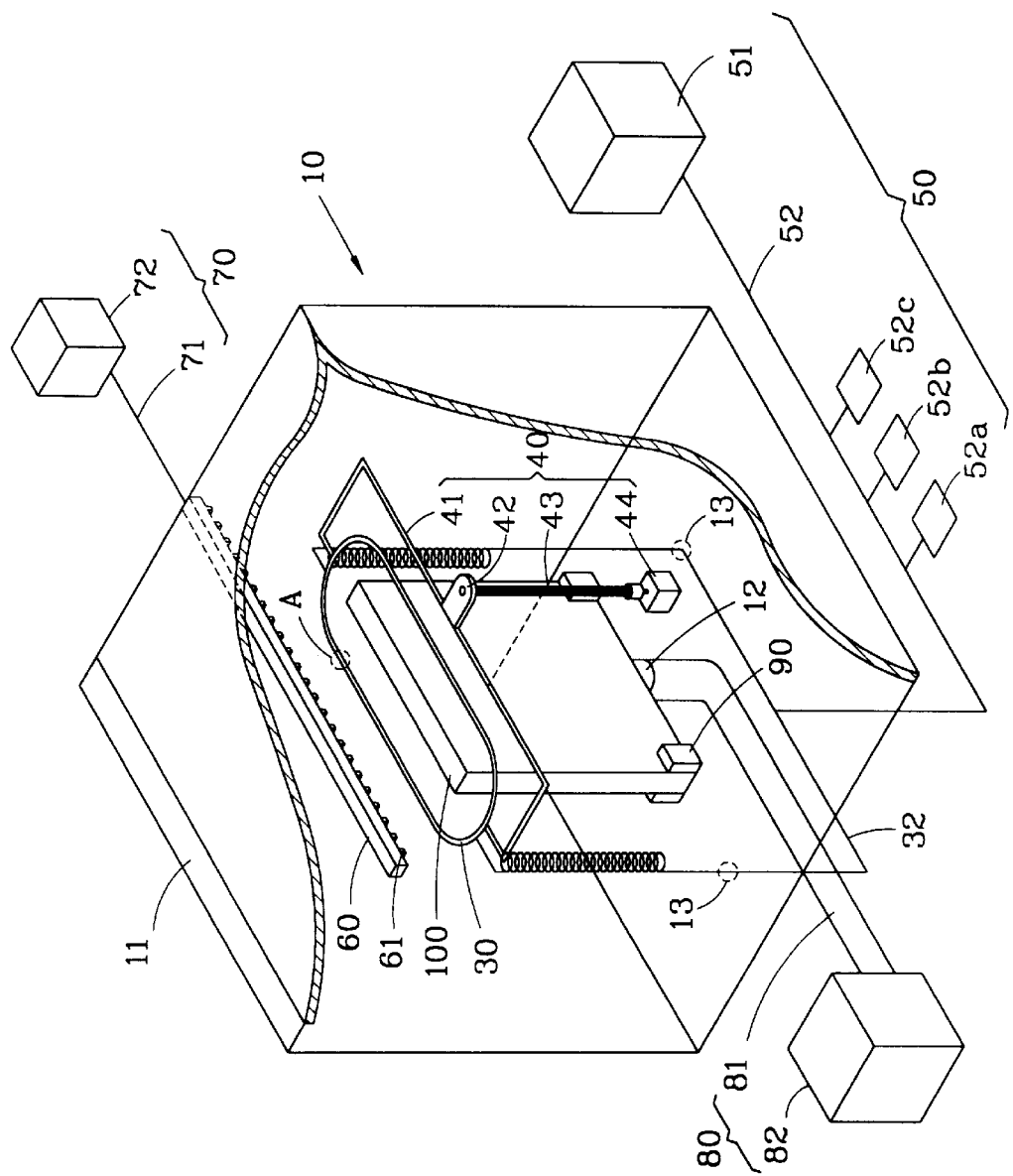
FIG. 2 is a perspective view illustrating elements of a reticle cleansing apparatus according to the preferred embodiments of present invention.

Referring to FIG. 2, a reticle cleaning apparatus according to the present invention includes a hexahedral chamber 10 having a door 11 provided at one of its sides, a drain vent 12 through its bottom center, and a pair of first openings 13 through bottom portions adjacent to the drain vent 12. A door switching member (not shown) is disposed to a side portion of the apparatus. A gas injection nozzle 30 is disposed in an upper space in the chamber 10 to inject cleaning gas onto a target reticle 100. A nozzle transport member 40 is connected to the gas injection nozzle 30 and enables the gas injection nozzle 30 to move up and down and appropriately inject the cleaning gas onto the reticle. A gas supply member 50 supplies cleaning gas required to cleaning the reticle into the gas injection nozzle 30. An ion injection nozzle 60 is disposed above the gas injection nozzle 30 in the chamber 10 to prevent a static electricity. An ion supply member 70 supplies ions to the ion injection nozzle 60. A drain member 80 is provided outside the chamber 10 to externally discharge the cleaning gas injected into the chamber 10 through the gas injection nozzle 30. A set of clamps 90 are provided on the bottom of the chamber 10 between the drain opening 12 and the first opening 13 so as to vertically hold the reticle therebetween.

The nozzle transport member 40, the gas supply unit 50, the ion injection nozzle 60, the ion supply member 70, and the drain member 80 will be more fully described with reference to FIG. 2 as follows.

The nozzle transport member 40 includes a nozzle fixing frame 41 for being directly connected to each side of the outer peripheral portions of the gas injection nozzle 30, a second nut box 42 connected to a side of the nozzle fixing frame 41, a second lead screw 43 being vertically connected by a screw to the second nut box 42, thereby vertically reciprocating the nozzle fixing frame 41, and a second stepping motor 44 connected to an end portion of the second lead screw 43. The second stepping motor 44 is disposed at the bottom portion in the chamber 10.

The gas supply member 50 includes a gas supply unit 51 disposed at an external portion of the chamber 10 for supplying a cleaning gas, and a gas supply line 52 connecting the gas supply unit 51 to a second opening 32 of the gas injection nozzle 30 through the first opening 13 in the chamber 10. The gas supply line 52 outside the chamber 10 is connected by a check valve 52a for preventing a reverse flow of the cleaning gas which flows from the gas supply unit 51, a flow-meter 52b for controlling the flow amount of the cleaning gas provided thereto, a regulator 52c for controlling the pressure of the cleaning gas supplied thereto, and a gauge (not shown) connected to the regulator 52c. The gauge serves to visualize the pressure of the cleaning gas.

The ion injection nozzle 60 is a squared bar type tube. A plurality of injection openings 61 are formed toward the reticle vertically placed on the bottom in the chamber 10, and a third opening (not shown) is formed at a side of the ion injection nozzle 60.

The ion supply member 70 includes an ion supply unit 71 disposed outside the chamber, and an ion supply line 72 for transferring the ions through the opening of the ion injection nozzle 60 into the chamber 10. One end portion of the ion supply line 71 is connected to the ion supply unit 72 and another end portion of the ion supply line 71 is connected to the ion injection nozzle 60.

The drain member 80 includes a drain pump 82 disposed outside the chamber 10 and for pumping the cleaning gas from the chamber 10 by a pumping operation, and a gas drain line 81 serving as a path of the drained cleaning gas from the cleaning chamber, so that an end portion of gas drain line 81 is connected to the drain vent 12 and another end portion of the gas drain line 81 is connected to the drain pump 82.

Figure 3:
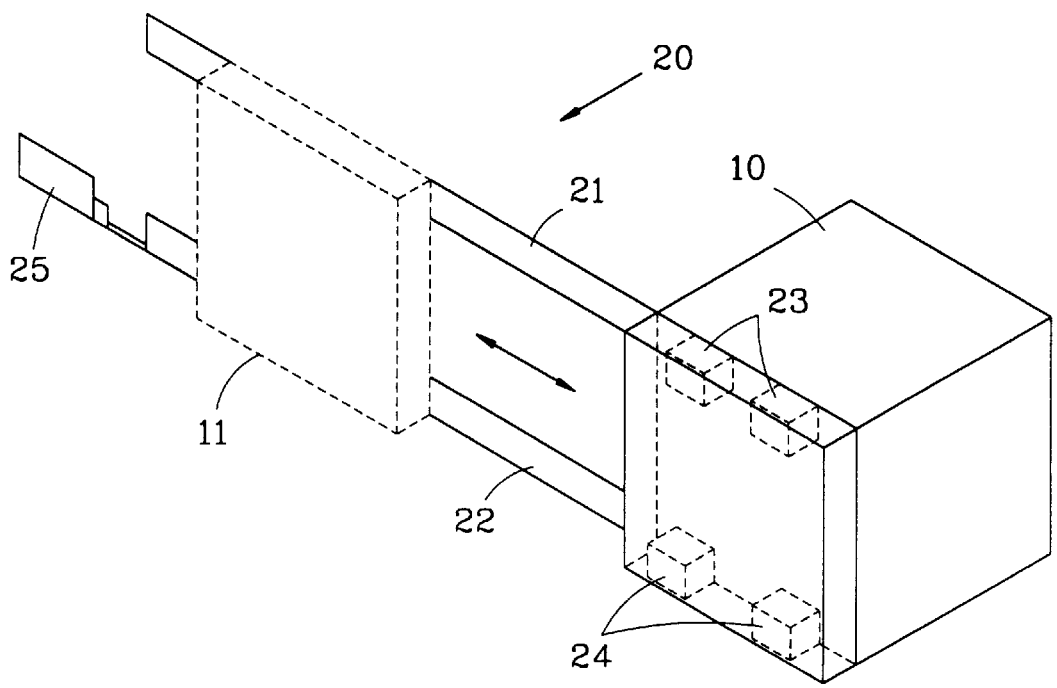
FIG. 3 is a perspective view illustrating a door switching member of FIG. 2.

As shown in FIG. 3, the door switching member 20 includes a linear motion (LM) guide 21 and a first lead screw 22 disposed along an upper portion and lower portion of the door side of the chamber 10 to be in contact with the door 11. A pair of LM guide bearings 23 and a pair of first nut boxes 24 are disposed at an upper portion and a lower portions of the door 11 to respectively correspond to the LM guide 21 and the lead screw 22. A first stepping motor 25 is connected to an end portion of the first lead screw 22 for horizontally moving the door 11 along the first lead screw 22.

Figure 4:
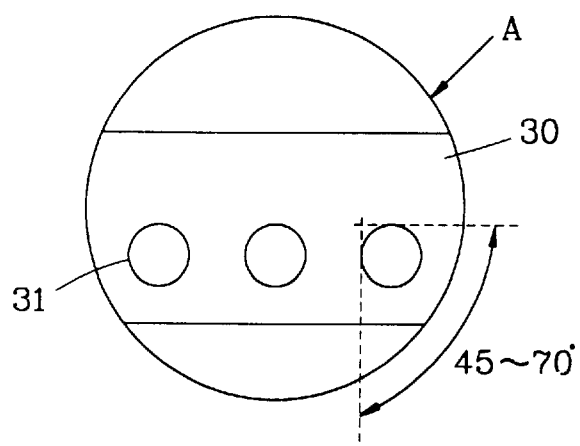
FIG. 4 is an enlarged view of portion A in FIG. 2.

FIG. 4 is an enlarged view of portion A of FIG. 2. The gas injection nozzle 30 is an elliptical tube having a plurality of injection vents 31 appropriately spaced apart from each other, and a predetermined angle is set for each of the respective injection vents 31 of the gas injection nozzle 30 to facilitate the gas injection from the nozzle 30 onto the reticle vertically fixed to the bottom in the chamber 10 by the clamps 90. Two pairs of second openings (not shown) are formed at portions of the gas injection nozzle 30 to guide the cleansing gas into the gas injection nozzle 30.

The operation of the reticle cleaning apparatus for a wafer exposure system will be described with reference to FIGS. 2 and 3.

When the first stepping motor 25 of the door switching member 20 rotates clockwise or counter-clockwise, the first lead screw 22 connected to the first stepping motor 25 also rotates clockwise or counter-clockwise, accordingly. The door 11 including the first nut boxes 24 connected by a screw to the first lead screw 22 moves to the left or right depending on the LM guide bearings 23 connected to the LM guide 21, thereby opening or closing the chamber 10.

When the door 11 is opened, a reticle is moved into the chamber 10. After the reticle moved into the chamber 10 is fixed to the bottom in the chamber 10 by the clamps 90, the door 11 is closed back in sequence.

Subsequently, when a valve of the gas supply unit 51 of the gas supply member 50 is opened, the cleaning gas is injected through the injection vents 31 of the gas injection nozzle 30 and along the gas supply line 52 into the gas injection nozzle 30. Simultaneously, the drain pump 81 of the drain member 80 connected to the drain vent 12 of the chamber 10 begins pumping to drain. Also, the ion injection nozzle 60 of the ion supply member 70 receives the ions from the ion supply unit 71 and begins injecting the ions through the injection openings 61 toward the reticle. Such a drain operation of the drain pump 81 and the ion injection operation of the ion injection nozzle 60 continue until the reticle cleaning operation is completed.

When the cleaning gas provided into the gas injection nozzle 30 is injected through the plurality of injection holes formed by predetermined intervals along the inner periphery of the gas injection nozzle 30 onto the reticle, the second stepping motor 44 of the nozzle transport member 40 rotates clockwise or counter-clockwise for the second lead screw 43 connected to the second stepping motor 44 to rotate in accordance with the rotation of the second stepping motor 44. Accordingly, the gas injection nozzle 30 connected to the second nut boxes 42 reciprocates in a vertical direction, so that the gas injection nozzle 30 connected to the nozzle fixing frame 41 moves upwardly and downwardly along the vertically provided reticle during the injection of the gas through the nozzle injection openings onto the reticle.

Such a cleaning gas injection is carried out in proportion to the frequency of the vertical reciprocation motion for a predetermined time. When the required frequency for the predetermined time is reached, the cleaning gas injection by the gas injection nozzle 30 is interrupted in accordance with locking the valve of the gas supply unit 51 in the gas supply member 50. Accordingly, the drain operation of the drain member 80 is also stopped, thereby completing the reticle cleaning. The same operation is repeated with regard to subsequently provided reticles.

When the reticle cleaning operation is completed, the door 11 of the chamber 10 is opened, and the clamps 90 holding the reticle are released, so that the reticle is taken out from the chamber 10. The reticle is then moved to the subsequent stages for its exposing operation.

FIG. 4 is a partial view of an enlarged portion A in the gas injection nozzle 30 in FIG. 2. The injection vents 31 are formed along the inner periphery of the gas injection nozzle 30. Each of the injection vents 31 are angled between 45° and 70° for a desirable cleaning operation of the reticle.

As described above, the reticle cleaning apparatus for a wafer exposure system according to the present invention allows the reticle to be cleansed just before the exposure operation and to be moved to the final reticle stage, so that a reticle pattern becomes identical to a photoresist film on a wafer.

Further, the reticle cleaning apparatus according to the present invention prevents the reticle from being damaged and contaminated by exterior substances, such as dust, in the atmosphere.

It will be apparent to those skilled in the art that various modifications and variations can be made in the reticle cleaning apparatus for wafer exposure system thereof of the present invention without departing from the spirit or scope of the inventions. Thus, it is intended that the present invention cover the modifications and variations of this invention provided they come within the scope of the appended claims and their equivalents.

What is claimed is:

1. A reticle cleaning apparatus for a wafer exposure system, comprising:
    a chamber enclosing the reticle;
    a door opening and closing at least one side of the chamber;
    a door switching member opening and closing the door coupled to the chamber including the door;
    a gas injection nozzle at an upper portion of the chamber;
    a nozzle transport member moving the gas injection nozzle in a vertical direction;
    a gas supply member supplying a cleaning gas into the gas injection nozzle;
    an ion injection nozzle over the gas injection nozzle;
    an ion supply member supplying ions into the ion injection nozzle; and
    a drain member draining the cleaning gas outside the chamber.

2. The apparatus according to claim 1, wherein the door switching member comprises:
    a linear motion guide attached along an upper end portion of the chamber;
    a first lead screw attached along a lower end portion of the chamber, the linear motion guide and the first lead screw contacting the door;
    a pair of linear motion guide bearings at an upper portion of the chamber corresponding to the linear motion guide;
    a pair of first nut boxes at a lower portion of the chamber corresponding to the lead screw; and
    a first stepping motor coupled to an end portion of the first lead screw horizontally driving the door along the first lead screw.

3. The apparatus according to claim 1, wherein the gas injection nozzle includes an elliptical tube.

4. The apparatus according to claim 1, wherein the gas injection nozzle has a plurality of injection vents.

5. The apparatus according to claim 1, wherein each injection vent has an angle with respect to a bottom of the chamber to facilitate injecting the cleaning gas onto the reticle.

6. The apparatus according to claim 1, wherein the gas injection nozzle has two pairs of openings guiding the cleaning gas into the gas injection nozzle.

7. The apparatus according to claim 5, wherein the angle includes an angle between 45° and 70°.

8. The apparatus according to claim 1, wherein the gas supply member comprises:
    a gas supply unit supplying the cleaning gas into the chamber;
    a gas supply line coupled to the gas supply unit carrying the cleaning gas to the gas injection nozzle;
    a check valve connected to the gas supply line preventing a reverse flow of the cleaning gas;
    a flow-meter controlling a flow amount of the cleaning gas provided to the check valve;
    a regulator controlling a pressure of the cleaning gas supplied to the check valve; and
    a gauge connected to the regulator.

9. The apparatus according to claim 1, wherein the nozzle transport member comprises:
    a nozzle fixing frame connected to each side of the outer peripheral portions of the gas injection nozzle;
    a second nut box connected to a side of the nozzle fixing frame;
    a second lead screw vertically connected to the second nut box and moving the nozzle fixing frame in a vertical direction; and
    a second stepping motor connected to an end portion of the second lead screw.

10. The apparatus according to claim 1, wherein the ion injection nozzle includes a squared bar type tube.

11. The apparatus according to claim 1, wherein the ion injection nozzle has a plurality of ion injection openings along the ion injection nozzle toward the reticle.

12. The apparatus according to claim 1, wherein the ion supply member comprises:
    an ion supply unit outside the chamber; and
    an ion supply line transferring the ions through an opening of the ion injection nozzle into the chamber, first end portion of the ion supply line connected to the ion supply unit, and second end portion of the ion supply line connected to the ion injection nozzle.

13. The apparatus according to claim 1, wherein the drain member comprises:
    a drain pump outside the chamber pumping out the cleaning gas from the chamber; and
    a gas drain line serving as a path for the cleaning gas drained from the chamber, a first end portion of the gas drain line connected to a drain opening and a second end portion of the gas drain line connected to the drain pump.

14. The apparatus according to claim 1, further comprising a pair of clamps holding a bottom of the reticle.

15. The apparatus according to claim 1, wherein the chamber has a polyhedral or spherical shape.

\* \* \* \* \*